United States Patent [19]

Massie

[11] Patent Number: 5,748,747

[45] Date of Patent: *May 5, 1998

[54] DIGITAL SIGNAL PROCESSOR FOR ADDING HARMONIC CONTENT TO DIGITAL AUDIO SIGNAL

[75] Inventor: Dana C. Massie, Capitola, Calif.

[73] Assignee: Creative Technology, LTD, Singapore

[*] Notice: The term of this patent shall not extend beyond the expiration date of Pat. No. 5,524,074.

[21] Appl. No.: 838,750

[22] Filed: Apr. 9, 1997

Related U.S. Application Data

[63] Continuation of Ser. No. 544,862, Oct. 18, 1995, abandoned, which is a continuation of Ser. No. 905,559, Jun. 29, 1992, Pat. No. 5,524,074.

[51] Int. Cl.$^6$ ................................................ H03G 3/00
[52] U.S. Cl. ............................................................ 381/61
[58] Field of Search .................................. 381/61; 84/622, 84/659

[56] References Cited

U.S. PATENT DOCUMENTS

| | | |
|---|---|---|
| 4,211,138 | 7/1980 | Deutsch . |
| 4,282,790 | 8/1981 | Wachi . |
| 4,991,218 | 2/1991 | Kramer . |
| 5,134,919 | 8/1992 | Kunimoto . |

OTHER PUBLICATIONS

*TTL Devices*, Texas Instruments, specification pp. 3–555—3–556.

*Digital Wave-Shaping Synthesis*, Marc Le Brun, Journal of the Audio Engineering Society, Apr. 1979, vol. 27, No. 4.

*Primary Examiner*—Wing F. Chan
*Assistant Examiner*—Ping W. Lee
*Attorney, Agent, or Firm*—Townsend and Townsend and Crew LLP

[57] ABSTRACT

A digital audio signal processor for adding harmonic content to an input audio signal through a non-linear transfer function with discontinuities. The discontinuities are generated by bit shifting each input value by an amount dependent on the sign and magnitude of the input value. The amount by which the input value is shifted is roughly inversely related to the magnitude of the logarithm of the input value. The transfer function is fractal and so provides increased harmonic content for all signal amplitudes.

9 Claims, 8 Drawing Sheets

DIGITAL SIGNAL PROCESSOR FOR ADDING HARMONIC CONTENT TO DIGITAL AUDIO SIGNAL

This is a continuation of application No. 08/544,862, filed Oct. 18, 1995, now abandoned, which is a continuation of application No. 07/905,559, filed Jun. 29, 1992, now U.S. Pat. No. 5,524,074, issued Jun. 4, 1996.

BACKGROUND OF THE INVENTION

The present invention relates to electronic musical instruments and more particularly to signal processing of musical audio signals to provide expanded spectral content.

Throughout the evolution of electronic music, it has been desirable to modify the sounds of electronic musical instruments, such as keyboards and guitars, to increase the harmonic content in a musically useful way. Typically the amount of added harmonic content is dependent on the amplitude of the original signal. This has been accomplished using processing features inherent in analog technology processors employing vacuum tubes and diodes to produce distortion or "fuzz."

In general, the source of the increased harmonic content is a non-linear transfer function. Thus the limiting or "clipping" phenomenon found in most analog amplifiers has been used as a source of increased harmonic content in music, and subsequently the same basic techniques have been employed in devices specifically designed for the purpose of producing such distortions.

More recently, digital electronic techniques have been applied to the problem. U.S. Pat. No. 4,991,218 discusses table lookup techniques for producing such non-linear transfer functions. While such techniques are in theory completely general in their capacity for producing transfer functions, it is found that to generate certain desirable transfer functions such techniques are not practical or efficient.

A look-up table may be reduced in size by combining an interpolation step with two look-up steps. The instruction set of many general purpose digital signal processors (DSP's) requires ten to twenty instructions to implement a table lookup algorithm when table compression techniques are employed to make the data size manageable. Furthermore, when interpolation is utilized, it becomes impossible to generate abrupt discontinuities.

Another digital technique previously employed (for instance see Digital Wave-Shaping Synthesis, Marc Le Brun, Journal of the Audio Engineering Society, Apr. 1979, Vol. 27, No. 4) uses Tchebyschev functions to approximate an arbitrary non-linear transfer function. This approach also has difficulties similar to those associated with table lookup techniques in that in order to represent a discontinuity with Tchebyschev functions requires an infinite series. A good approximation typically requires a 4th or 5th order series for each discontinuity. In some desirable non-linear transfer functions there are as many as 32 discontinuities, thereby necessitating a 128th order polynomial to accurately represent the transfer function. Even a much smaller order polynomial takes numerous DSP instructions to compute. Hence, the use of Tchebyschev functions also has undesirable computational complexity and lacks the ability to accurately represent discontinuities.

SUMMARY OF THE INVENTION

It is an object of the present invention is to provide added harmonic content to an audio signal in a computationally efficient way.

The present invention introduces distortion to an input audio signal consisting of a sequence of input sample values. For each sample value a priority encoder determines the bit number of the most significant bit which differs from the sign bit. The bit number is fed to a barrel shifter which left-shifts the input sample value to produce an output sample value, so that the sign bit of the output sample value differs in polarity from the next most-significant bit.

Other objects, features and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

The present invention primarily translates, on a point to point basis, samples of an input digital audio signal denoted as f(t), where t is time, to an output signal denoted as g(t) according to a non-linear transfer function T, i.e., g(t)=T[f(t)]. The translation is completely specified by the transfer function. Any such non-linear translation distorts the signal and hence adds harmonic content. There are many techniques possible to implement a particular transfer function.

Figure 1:
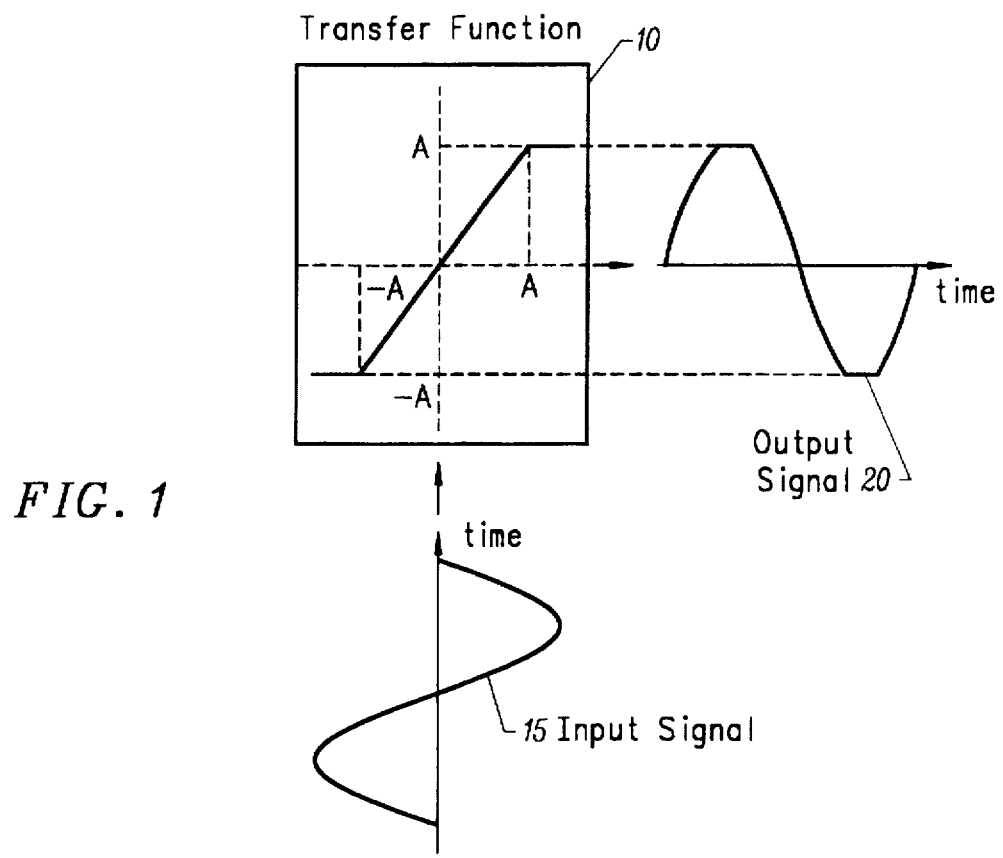
FIG. 1 illustrates distortion of a sine wave by a nonlinear transfer function.

FIG. 1 illustrates the effect of a transfer function 10 on a period of a sinusoidal input signal 15. The transfer function 10 is linear about the origin and produces "clipping" by reaching maximum positive and negative values of A and −A when the magnitude of the input signal 15 is greater than A. Fourier decomposition of the output signal 20 indicates that the transfer function 10 adds harmonic content to the pure sinusoidal input 15.

The transfer functions of the preferred embodiments of the present invention have certain unique characteristics. First, they include a number of discontinuities. These discontinuities play an important role in introducing the harmonic content to the output signal. With these discontinuities, relatively small changes in input amplitude cause musically useful changes in harmonic content. The discontinuities may be arranged in such a way that the transfer function exhibits an approximate scale invariance, in particular $$g(t)=T[f(t)]=T[2^n f(t)],$$

where n is an integer.

It is possible to implement such transfer functions (as well as any other transfer function) using an exhaustive table lookup. Such an approach would accomplish some of the objects of the present invention, however, the required memory for the table lookup could be prohibitive. A table look-up for a signal represented by sixteen bits requires 65,536 sixteen bit entries.

Figure 2:
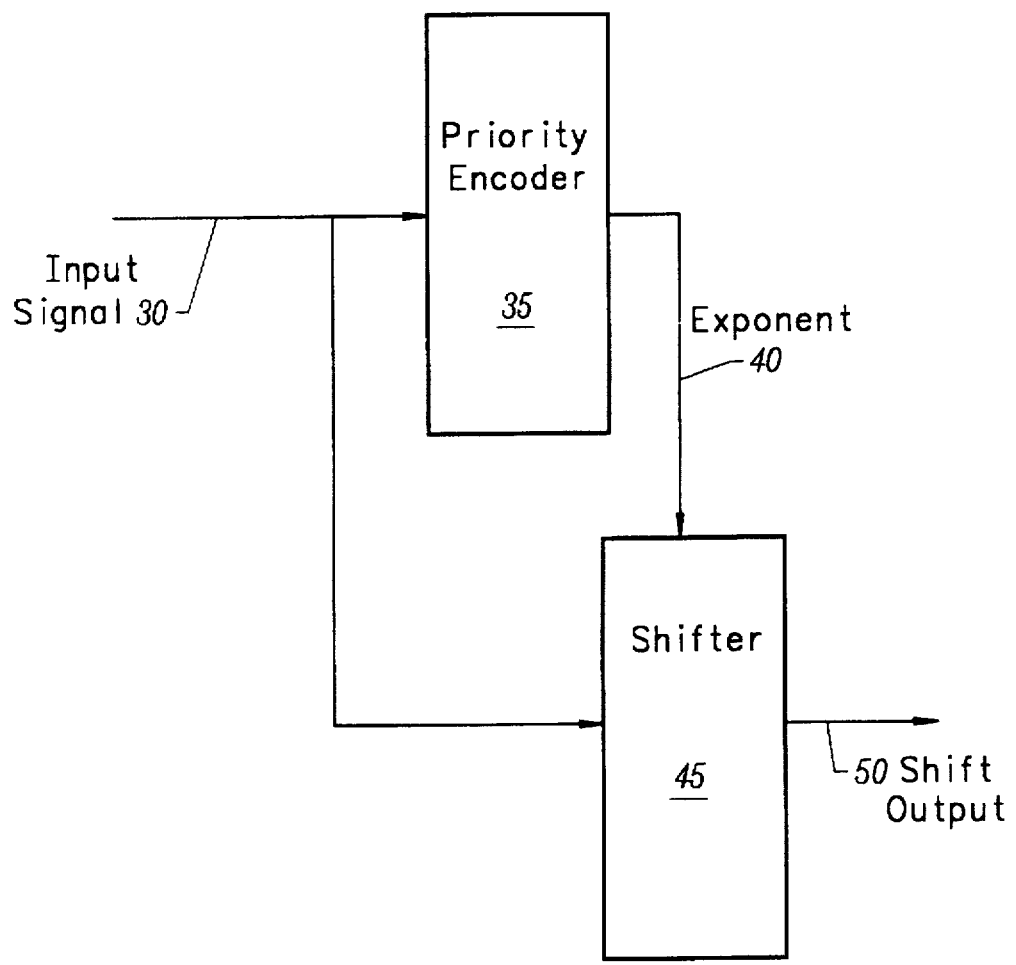
FIG. 2 shows the circuit of a first embodiment of the present invention.

FIG. 2 shows a first embodiment of the present invention. The input signal 30 is a sixteen bit 2's-complement integer between −32768 and +32767. In 2's-complement numbers, the most significant bit is the sign bit, i.e. when the most significant bit is 0 the integer is positive, and when the left-most bit is 1 the integer is negative. Positive 2's-complement integers have a normal binary representation and negative integers are generated by reversing the polarity of every bit of the corresponding positive integer and adding 1. For instance, the numbers −3, 2, −1, 0, 1 and 2 are represented by the five-bit 2's-complement numbers 11101, 11110, 11111, 00000, 00001, 00010, and 00011. Although the mantissa fuzz circuit of the present invention operates on sixteen bit signals, for convenience many of the following examples will be described in terms of five-bit numbers.

Priority encoder 35 determines the bit number (the least significant bit being numbered as one) of the first bit from the left which differs in polarity from the sign bit, and computes an exponent 40 given by $$\text{exponent} = N\text{-bit number}-1,$$

where N is the bit length of the input sample 30. For instance, the priority encoder 35 returns exponent values of 1, 0, and 3 when the input signal 30 has a 2's-complement representations of 11000, 01000, and 11110, respectively. The priority encoder may be implemented using Texas Instruments chips SN74148 or SN74LS148.

Shifter 45 is a barrel shifter which left shifts the input signal 30 by exponent 40 bits to produce a shifted output 50. The new bits which are inserted at the right-hand side of the shifted output 50 are given a polarity of zero. The shifted output 50 therefore has the same sign as the input signal 30, and the bit to the right of the sign bit is of opposite polarity to the sign bit.

Figure 3:
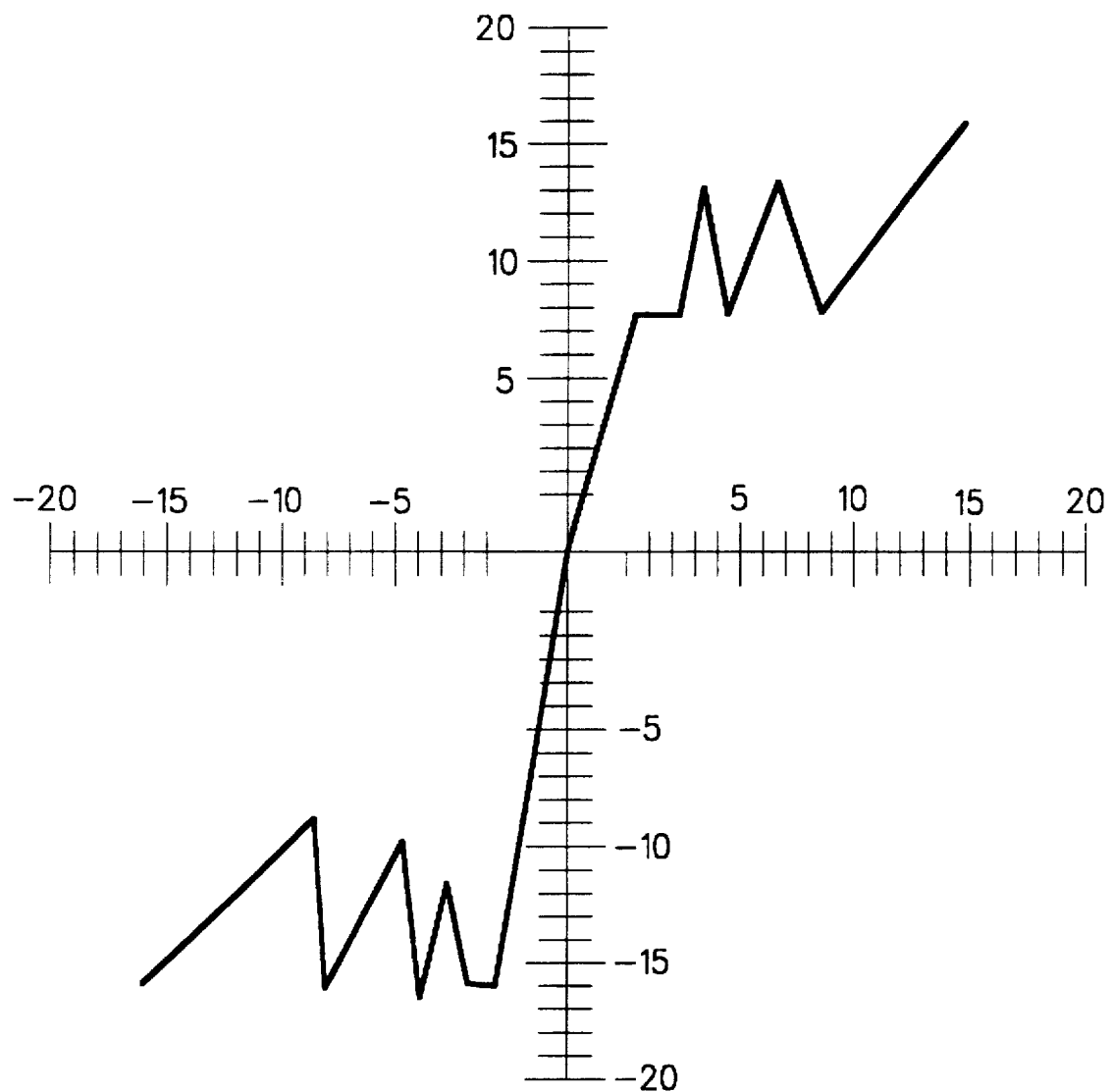
FIG. 3 shows the transfer function of the first embodiment of the present invention for 5-bit signals.

Table 1 lists the input and output of the mantissa fuzz circuit for five-bit 2's-complement numbers. The first column of the table lists the decimal value of the numbers, the second column lists the corresponding 2's-complement values of the numbers, the third column lists the amount by which the shifter 45 left-shifts the binary number, the fourth column lists the segment number to which the point is assigned, the fifth column lists the decimal values of the shifted numbers, and the sixth column lists the 2's-complement values of the numbers. FIG. 3 graphically depicts the data in Table 1. Each point in a given segment has the same shift value. For N-bit numbers the segment values run from −(N−1) to (N−1). Roughly, each positive slope portion of the transfer function is assigned a segment number. Since the gain scaling operation is implemented using shifts, the gain values are powers of 2. The circuit 20 of FIG. 2 is similar to an automatic gain control circuit, operating instantaneously, and with a non-linearity in the gain computation circuit. The transfer function of FIG. 3 is clearly asymmetric. Asymmetric transfer functions are musically desirable since they introduce even harmonics. In fact, the transfer function of tube amplifiers popular with rock musicians have asymmetric transfer functions.

TABLE 1

| decimal input | binary form | shift | segment | decimal output | binary form |
|---|---|---|---|---|---|
| −16 | 1 0000 | 0 | −4 | −16 | 1 0000 |
| −15 | 1 0001 | 0 | −4 | −15 | 1 0001 |
| −14 | 1 0010 | 0 | −4 | −14 | 1 0010 |
| −13 | 1 0011 | 0 | −4 | −13 | 1 0011 |
| −12 | 1 0100 | 0 | −4 | −12 | 1 0100 |
| −11 | 1 0101 | 0 | −4 | −11 | 1 0101 |
| −10 | 1 0110 | 0 | −4 | −10 | 1 0110 |
| −9 | 1 0111 | 0 | −4 | −9 | 1 0111 |
| −8 | 1 1000 | 1 | −3 | −16 | 1 0000 |
| −7 | 1 1001 | 1 | −3 | −14 | 1 0010 |
| −6 | 1 1010 | 1 | −3 | −12 | 1 0100 |
| −5 | 1 1011 | 1 | −3 | −10 | 1 0110 |
| −4 | 1 1100 | 2 | −2 | −16 | 1 0000 |
| −3 | 1 1101 | 2 | −2 | −12 | 1 0100 |
| −2 | 1 1110 | 3 | −1 | −16 | 1 0000 |
| −1 | 1 1111 | 4 | 0 | −16 | 1 0000 |
| 0 | 0 0000 | 4 | 0 | 0 | 0 0000 |
| 1 | 0 0001 | 3 | 1 | 8 | 0 1000 |
| 2 | 0 0010 | 2 | 2 | 8 | 0 1000 |
| 3 | 0 0011 | 2 | 2 | 12 | 0 1100 |
| 4 | 0 0100 | 1 | 3 | 8 | 0 1000 |
| 5 | 0 0101 | 1 | 3 | 10 | 0 1010 |
| 6 | 0 0110 | 1 | 3 | 12 | 0 1100 |
| 7 | 0 0111 | 1 | 3 | 14 | 0 1110 |
| 8 | 0 1000 | 0 | 4 | 8 | 0 1000 |
| 9 | 0 1001 | 0 | 4 | 9 | 0 1001 |
| 10 | 0 1010 | 0 | 4 | 10 | 0 1010 |
| 11 | 0 1011 | 0 | 4 | 11 | 0 1011 |
| 12 | 0 1100 | 0 | 4 | 12 | 0 1100 |
| 13 | 0 1101 | 0 | 4 | 13 | 0 1101 |
| 14 | 0 1110 | 0 | 4 | 14 | 0 1110 |
| 15 | 0 1111 | 0 | 4 | 15 | 0 1111 |

Figure 4:
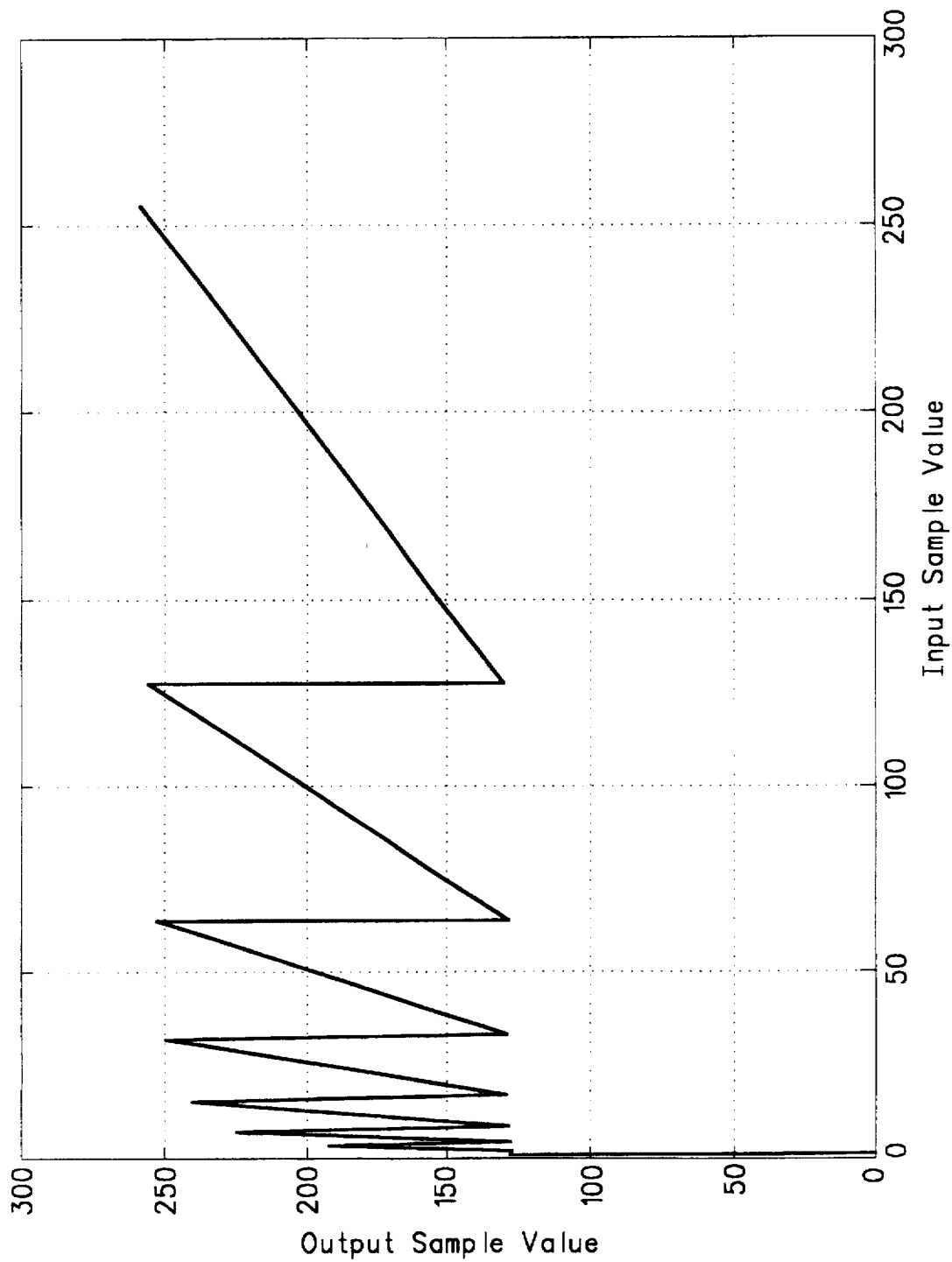
FIG. 4 shows the positive half of the transfer function of the first embodiment of the present invention for 8-bit signals.
Figure 5:
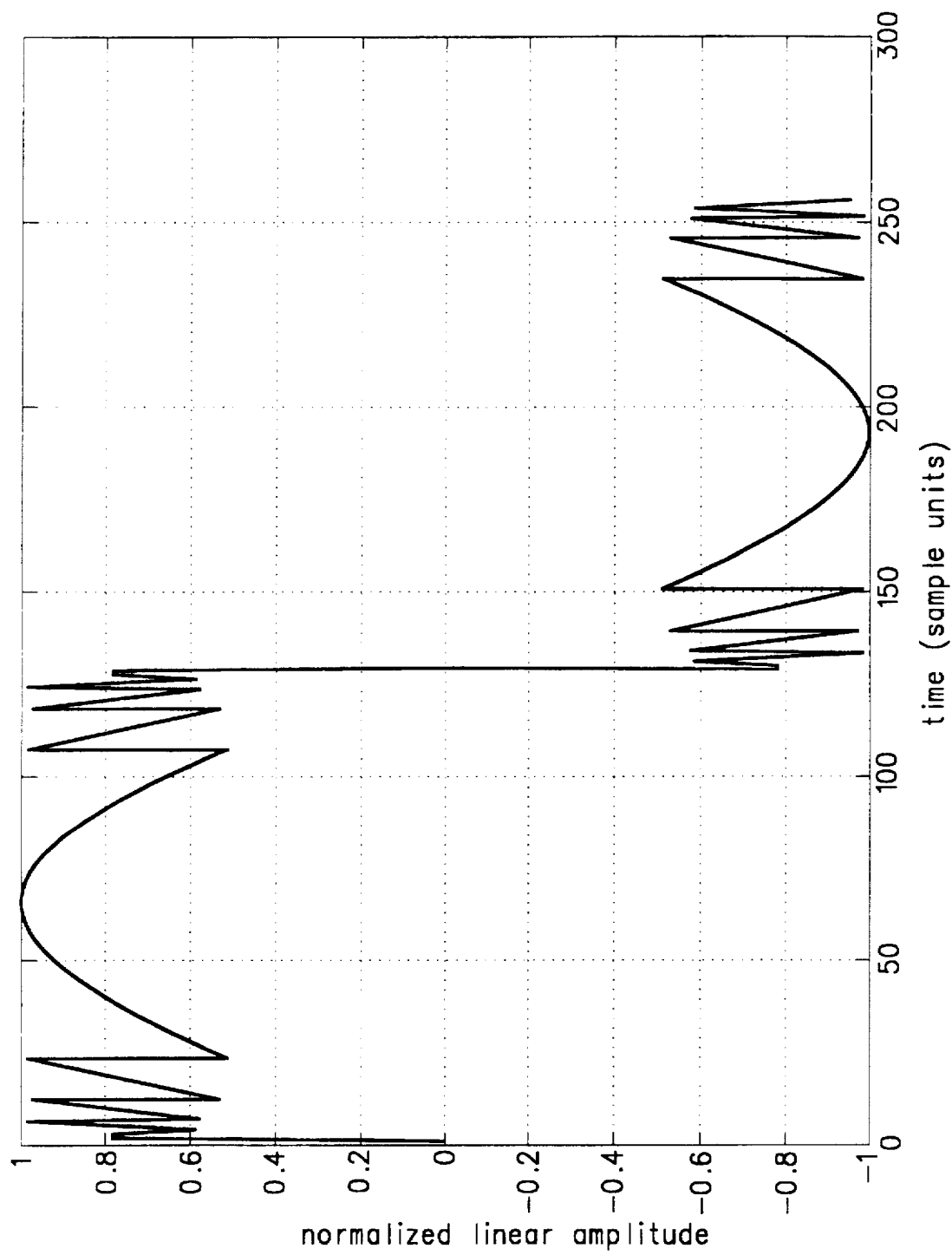
FIG. 5 is a graph of the output of the circuit of the first embodiment of the present invention where the input signal is a sine wave.

FIG. 4 shows the transfer function for eight-bit samples. Comparison of FIG. 4 with FIG. 3 shows that as the resolution of the transfer function is increased the asymmetry between the positive and negative portions of the transfer function becomes less apparent. The only significant differences between the positive and negative portions of the transfer function are in the ±1 and ±2 segments; as the resolution increases there are less points which defy the rule that each positive slope portion of the transfer function contains points in the same segment. FIG. 5 illustrates the output signal from the mantissa fuzz circuit of FIG. 2 where the input signal is a sine wave with a period of 256 sample units, and the peak amplitude of the input sinusoid has a magnitude of 256. For other values of the peak amplitude the rounded central hump in the positive and negative halves of the output would have an amplitude less than that of the surrounding sharp peaks. Clearly a considerable amount of harmonic content has been added to the signal by the mantissa fuzz circuit 20.

In many digital signal processors, the above operation can be accomplished with a few instructions, as the processor itself implements the priority encoder and shifter. Appendix A shows the assembly language code required to implement the transfer function on the 2105 processor manufactured by Analog Devices.

Since the mantissa fuzz circuit 20 amplifies low amplitude signals to full level, any noise in the input signal will also be amplified. This unwanted effect may be controlled by careful preparation of the signal stored in the wave table 170. If the noise is known to be only one bit in amplitude, then it can be removed by noise gating the input signal 130, i.e., masking off (removing) the least significant bit from the input signal 30 before it is transformed. Alternatively, the strong amplification of very low level signals can be controlled by the introduction of segment dependent scale factors and translation offsets as discussed below.

Figure 6:
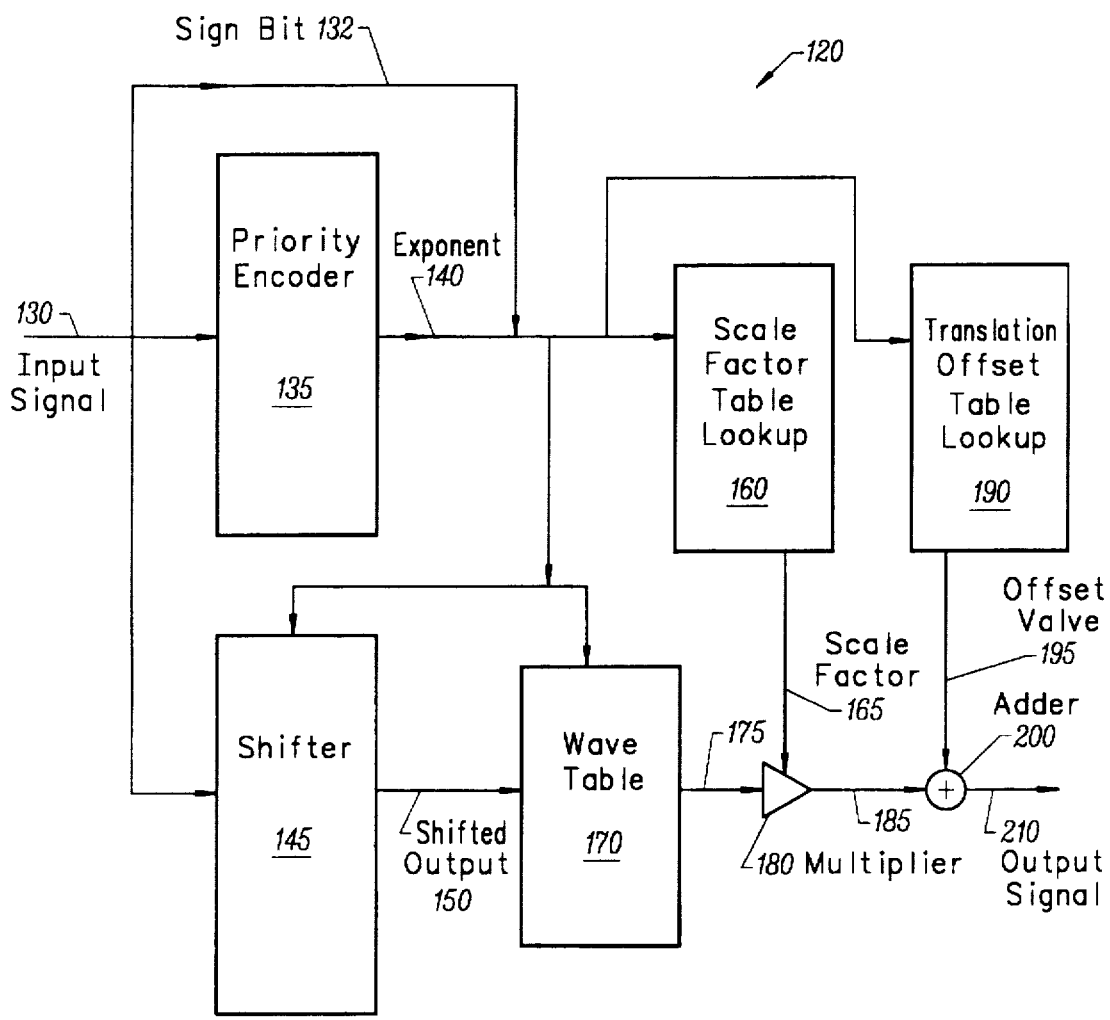
FIG. 6 shows the circuit of a second embodiment of the present invention.

FIG. 6 shows a circuit diagram for a second embodiment 120 of the present invention. As in the circuit 20 of the first embodiment, a priority encoder 135 determines the bit number (the rightmost bit being number one) of the first bit from the left which differs in polarity from the sign bit. Shifter 145 is a barrel shifter which left shifts the input sample 30 by (N-exponent −1) bits, where N is the bit length of the input signal 130, to produce a shifted output 150. The new bits which are created at the right-hand side of the shifted output 150 are given a polarity of 0. The shifted output 150 therefore has the same sign as the input signal 130, and the bit to the right of the sign bit is of opposite polarity to the sign bit.

Sign bit 132 from the input signal 130, the exponent 140 from the priority encoder 135 and the shifted output 150 are directed to a wave table 170. The wave table 170 circuit contains tables of 256 words. To select an element from a table requires an 8-bit address. These tables are therefore relatively small compared to the 65536 words needed for exhaustive table lookup for 16-bit numbers. The most significant eight bits of the shifted output 150 are used as the address input to the wave table 150 circuit.

The wave table 170 may contain a plurality of lookup tables so that a different table may be used for each different combination of sign bit 132 and exponent 140. In the two outer-most segments there are 16384 values, but only 256 equally spaced values are directly translated to output values 175 by the wave table 170. The remaining output values 175 are determined by interpolation. The outer-most segments are least accurately translated by the table lookup procedure. However, for segments nearer the origin the relative accuracy increases. When the signal lies in a segment of 256 points or less the wave table 170 maps every shifted output value 150 directly to an output level 175. In contrast, standard table lookups produce the same amount of distortion for small amplitude signals as for large, and therefore larger percentage errors for small amplitude signals. Since people hear logarithmically, the relevant measure of distortion is the percentage error. The present table lookup therefore offers the advantage of increased resolution of the wave shaper as the signal amplitude decreases.

The exponent 140 from the priority encoder 135 and the sign bit 132 of the input signal 130 are directed to a scale factor table 160 which generates a scale factor 165 which is used to control a multiplier 180. Entries in the scale factor table 160 are calculated by scale factor=Norm*2$^{-shift*Overlap}$, where Overlap is a user adjustable parameter. The overall gain of the transfer function is normalized by the parameter Norm, which is set equal to $2^{Overlap}$. In alternate embodiments the scale factor may have other values, for instance, the scale factors may also be dependent on the shift value as well as the polarity of the sign bit 132. When Overlap is set equal to one, the scale factor will reverse the action of the shifter. The degree of distortion of the output 185 from the multiplier 180 may be continuously varied by varying Overlap.

Figure 7:
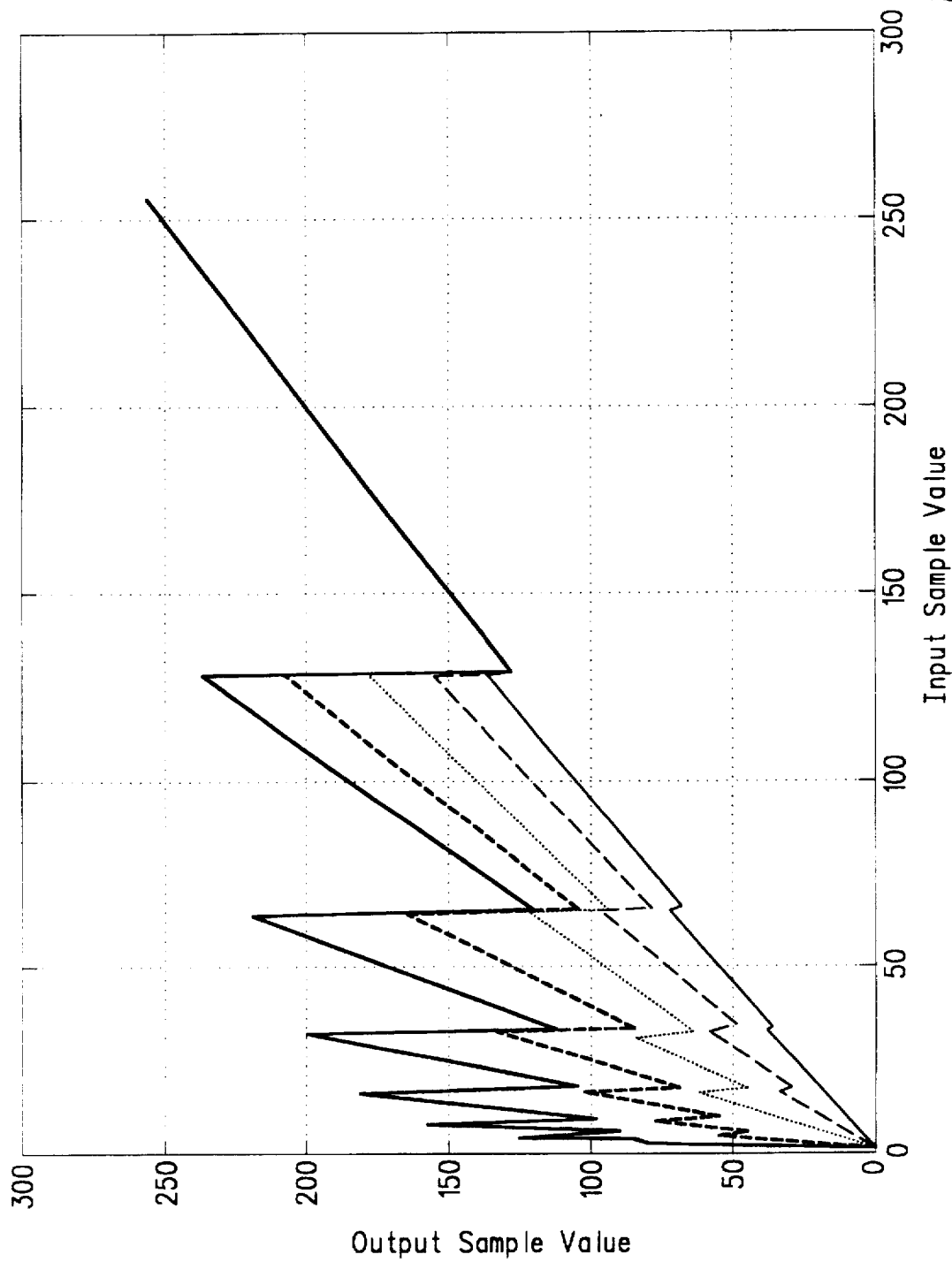
FIG. 7 illustrates the effect of a segment dependent scale factor on the transfer function of the second embodiment.

FIG. 7 depicts the positive half of the transfer function for signals at output 185 for five values of Overlap between zero and 1. When Overlap=½, segments overlap along the output axis by approximately 50%, and when Overlap=0.2, segments overlap by 20%.

Figure 8:
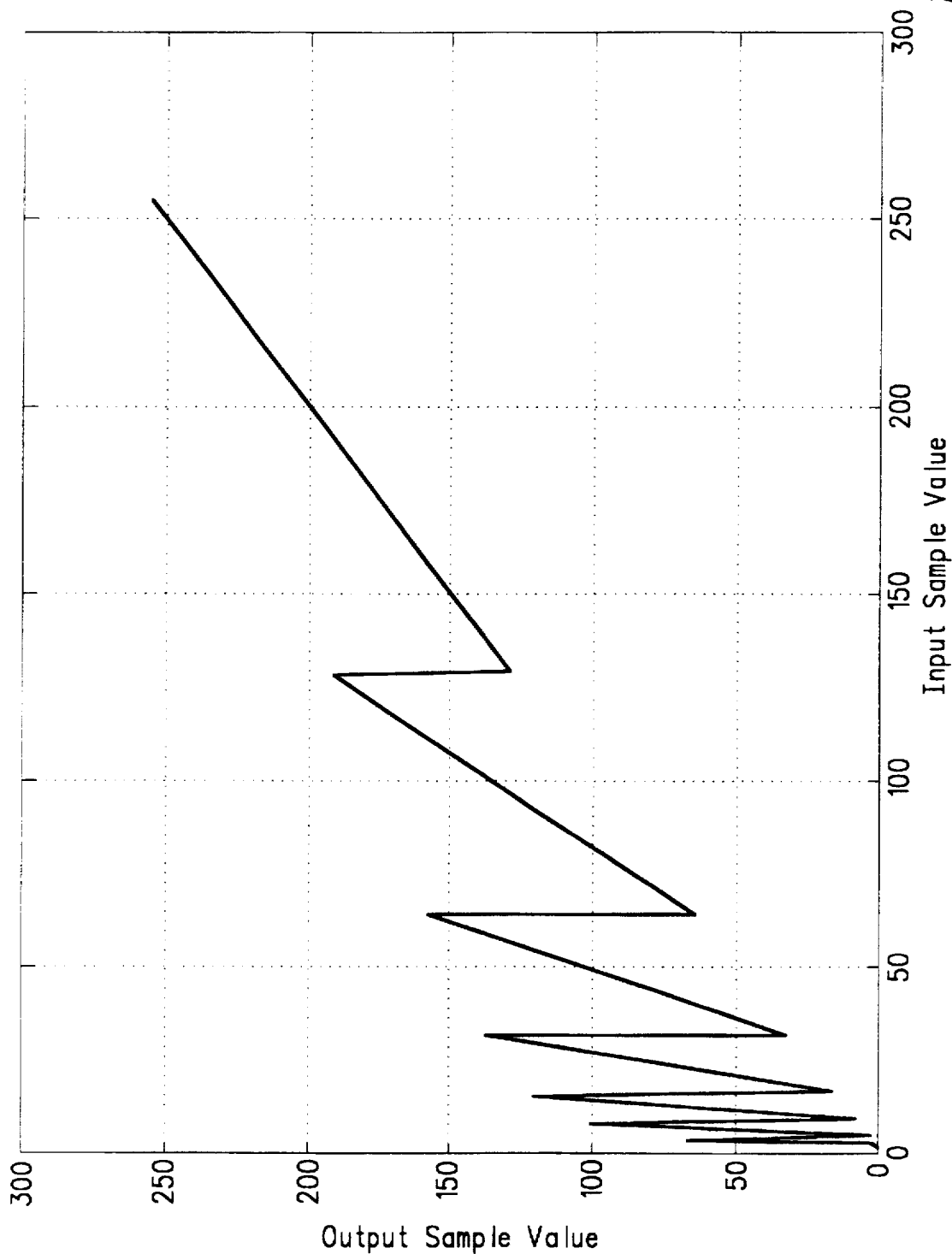
FIG. 8 illustrates the effect of a segment dependent translation offset on the transfer function of the second embodiment.

The sign bit 132 and the exponent 140 are also directed to a translation offset table 190. The offset value 195 chosen by the table is sent to adder 200 and is added to muliplier output 185 to generate circuit output signal 210. Table 2 lists a preferred set of offsets for 8-bit signals. The offsets in Table 2 bring the lowest points of each segment along a straight line as shown in FIG. 8.

TABLE 2

| segment number | offset |
|---|---|
| 1 | −127 |
| 2 | −126 |
| 3 | −124 |
| 4 | −120 |
| 5 | −112 |
| 6 | −96 |
| 7 | −64 |
| 8 | 0 |

Figure 9:
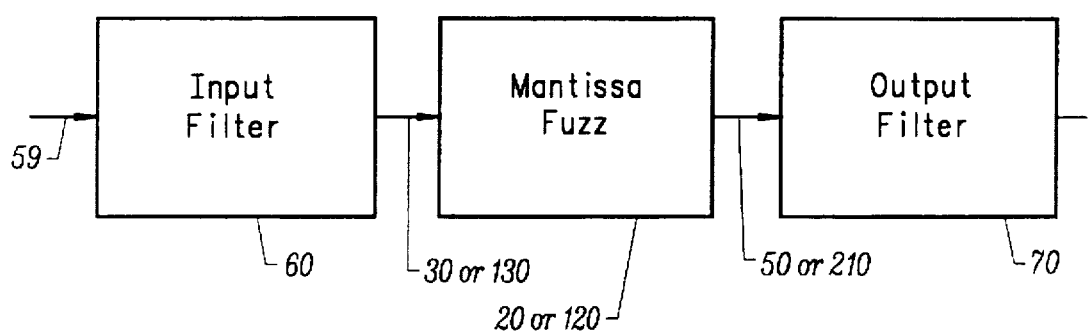
FIG. 9 shows input and output filters bracketing the mantissa fuzz circuit.

The mantissa fuzz circuits 20 and 120 are provided with an input filter 60 and an output filter 70 as shown in FIG. 9 to help control the overall sound quality. The input filter 60 controls what frequencies are distorted. Distortion of two or more sine waves generates intermodulation distortion, i.e., harmonics at the sum and difference frequencies of the sine waves. If an input signal 59 has a high harmonic content, low-pass filtering provided by the input filter 60 limits the amount of intermodulation distortion. The output filter 70 then allows tailoring of the harmonic content of the output 50 or 210 from the mantissa fuzz circuit 20 or 120. The input and output filters 60 and 70 are both 1-pole recursive filters. More complex filter types such as high-pass, low-pass, and formant filters for input and output shelving and parametric equalization, are more expensive but give more flexibility in tailoring the signal's harmonic content for musical purposes.

The input filter 60 contains a d.c. offset removal filter. Without such a filter the rms amplitude of the output 50 or 210 from the mantissa fuzz circuits 20 or 120 does not necessarily increase with an increase in the rms amplitude of the input. For signals stored in a sampler memory, the d.c. offset can be removed by computing the average (or mean) of the wave table, and then subtracting that value from every sample in the wave table. For signals coming from an Analog-To-Digital convertor, the DC offset can be removed using a simple high-pass filter with a single zero followed by a single pole.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. For example, the circuits 20 or 120 may be used to generate an exhaustive lookup table for N-bit signals by sequentially feeding all integers from $-2^N$ to $2^N-1$ into the circuit 20 or 120 as the input signal 130, and storing the output signal 50 or 210 as the table values; the amount by which the input signal values 130 is shifted may be dependent on other functions of the magnitude and sign of the input values 130; the wave table 170, the scale factor table 160, or the translation offset table 190 may be omitted from the circuit of the second embodiment 120; the outputs from the wave table 170, the scale factor table 160, the translation offset table 190 may be determined by calculation rather than table lookup and may be functions other than those disclosed herein; the wave tables 170 may have sizes less than or greater than 256 entries; the wave table 170 element may or may not utilize interpolation; the mantissa fuzz circuits 20 and 120 may be implemented using dedicated custom hardware, off-the-shelf digital signal processing chips or by software code; or entries in the wave tables 170, scale factor tables 160 and translation offset tables 190 could be selected by the user, possibly through a personal computer. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

---

Appendix A

```
* Code to implement the present invention on an Analog Devices
* 2105 Digital Signal Processor Chip. The actual distortion
* operation only takes two instructions, namely the "exp" and the
* "norm" instructions. Comments are included as text in curly
* brackets.
.macro   mantissaDistortion (
%0,    { address of input signal x }
%1,    { address of output signal y=f(x) }
%2,    { ticSize - number of samples to process in loop. }
%3,    { address of volume (amplitude) scaling parameter }
);
i0=%0;    { address of input signal x }
i1=%1;    { address of output signal y=f(x) }
my0 = dm( %3 ) ; { Load the volume (amplitude) scale factor }
cntr=ticSize*2;
do sampLoop until ce;
si=dm(i0,m1) ; {read input signal data into shifter input register}
se = exp si(hi);    { Find first bit set. }
sr = norm si (hi);    { Shift (or narmalize) operation. }
{ Now scale output volume (amplitude) }
mr= sr1 * my0(rnd);
sampLoop:
dm(i1,m1)=mr1, mr=0;        {Output distorted sample.}
.endmacro;
```

What is claimed is:

1. A digital signal processor for adding harmonic content to a stream of digital input values representing an arbitrary input audio signal to produce a stream of digital output values representing an output audio signal, comprising:

a priority encoder for determining a priority value based on a magnitude of one of said digital input values, said priority value being inversely related to a bit number representing the first bit from the left which differs in polarity from a sign bit;

a bit shifter for bit shifting said digital input value by an amount of bits dependent on said priority value to produce a digital output value, whereby said stream of output values has increased harmonic content relative to said stream of input values; and a translation offset adder for adding a number to said digital output values, said number determined by said priority value.

2. The processor of claim 1 further including a scale factor multiplier for multiplying said digital output value by a factor determined by said priority value.

3. The processor of claim 1 further including a wave modulator, said wave modulator generating a wave value dependent on said output value.

4. The processor of claim 3 wherein said wave modulator is a lookup table.

5. The processor of claim 1 wherein said bit shifter is a barrel shifter.

6. A digital signal processor for adding harmonic content to a stream of digital input values representing an arbitrary input audio signal to produce a stream of digital output values representing an output audio signal, comprising:

a priority encoder for determining a priority value based on a magnitude of one of said digital input values, said priority value being inversely related to a bit number representing the first bit from the left which differs in polarity from a sign bit; and a bit shifter for bit shifting said digital input value by an amount of bits dependent on said priority value to produce a digital output value, whereby said stream of output values has increased harmonic content relative to said stream of input values.

7. A method for generating entries of a lookup table of a digital signal processor for adding harmonic content to a stream of digital input values representing an arbitrary input audio signal to produce a stream of digital output values, said input values having a range of values from a negative integer to a positive integer, comprising the steps of:

determining a priority value equal to a constant minus a bit number representing the first bit from the left which differs in polarity from a sign bit from said negative integer to said positive integer, and bit shifting each integer from said negative integer to said positive integer by an amount of bits equal to said priority value to produce a set of table values for said lookup table.

8. The method of claim 7 wherein said amount of bits is equal to said priority value.

9. The method of claim 7 wherein said lookup table has discontinuities.

* * * * *